(12) United States Patent
Li

(10) Patent No.: US 7,417,248 B2
(45) Date of Patent: Aug. 26, 2008

(54) TRANSISTOR WITH SHALLOW GERMANIUM IMPLANTATION REGION IN CHANNEL

(75) Inventor: Hong-Jyh Li, Austin, TX (US)

(73) Assignee: Infineon Technologies AG, Munich (DE)

( * ) Notice: Subject to any disclaimer, the term of this patent is extended or adjusted under 35 U.S.C. 154(b) by 42 days.

(21) Appl. No.: 11/446,666

(22) Filed: Jun. 5, 2006

(65) Prior Publication Data

US 2006/0228875 A1  Oct. 12, 2006

Related U.S. Application Data

(62) Division of application No. 10/805,720, filed on Mar. 22, 2004, now Pat. No. 7,094,671.

(51) Int. Cl.
*H01L 29/04* (2006.01)
(52) U.S. Cl. .................. 257/55; 257/63; 257/200; 257/611; 257/E33.009; 257/E31.035; 438/518; 438/520
(58) Field of Classification Search .......... 257/18, 257/19, 63, 200, 237, 611, 616, E31.035, 257/E33.009, E29.104, 52, 53, 55; 438/518, 438/520
See application file for complete search history.

(56) References Cited

U.S. PATENT DOCUMENTS

| 5,108,935 A | 4/1992 | Rodder |
| 5,576,226 A | 11/1996 | Hwang |
| 5,596,218 A | 1/1997 | Soleimani et al. |
| 5,683,934 A | 11/1997 | Candelaria |
| 5,714,788 A | 2/1998 | Ngaoaram |

(Continued)

FOREIGN PATENT DOCUMENTS

EP 0 921 575 A2 8/1999

(Continued)

OTHER PUBLICATIONS

Ernst, T., et al., "A New Si:C Epitaxial Channel nMOSFET Architecture with Improved Drivability and Short-Channel Characteristics," 2003, 2003 Symposium on VLSI Technology Digest of Technical Papers, 2 pages, Document No. 4-89114-035-6/03.

(Continued)

*Primary Examiner*—W. David Coleman
*Assistant Examiner*—Su C Kim
(74) *Attorney, Agent, or Firm*—Slater & Matsil, L.L.P.

(57) ABSTRACT

A method of manufacturing a transistor and a structure thereof, wherein a very shallow region having a high dopant concentration of germanium is implanted into a channel region of a transistor at a low energy level, forming an amorphous germanium implantation region in a top surface of the workpiece, and forming a crystalline germanium implantation region beneath the amorphous germanium implantation region. The workpiece is annealed using a low-temperature anneal to convert the amorphous germanium region to a crystalline state while preventing a substantial amount of diffusion of germanium further into the workpiece, also removing damage to the workpiece caused by the implantation process. The resulting structure includes a crystalline germanium implantation region at the top surface of a channel, comprising a depth below the top surface of the workpiece of about 120 Å or less. The transistor has increased mobility and a reduced effective oxide thickness (EOT).

13 Claims, 3 Drawing Sheets

FIG. 3

U.S. PATENT DOCUMENTS

| | | | |
|---|---|---|---|
| 5,872,387 | A | 2/1999 | Lyding et al. |
| 5,986,287 | A | 11/1999 | Eberl et al. |
| 6,051,865 | A | 4/2000 | Gardner et al. |
| 6,060,755 | A | 5/2000 | Ma et al. |
| 6,100,558 | A | 8/2000 | Krivokapic et al. |
| 6,110,784 | A | 8/2000 | Gardner et al. |
| 6,261,889 | B1 | 7/2001 | Ono |
| 6,291,282 | B1 | 9/2001 | Wilk et al. |
| 6,303,450 | B1 | 10/2001 | Park et al. |
| 6,358,806 | B1 | 3/2002 | Puchner |
| 6,403,976 | B1 | 6/2002 | Saitoh et al. |
| 6,472,685 | B2 | 10/2002 | Takagi |
| 6,476,454 | B2 | 11/2002 | Suguro |
| 6,492,216 | B1 | 12/2002 | Yeo et al. |
| 6,498,374 | B1 | 12/2002 | Ohuchi |
| 6,528,851 | B1 | 3/2003 | Yu |
| 6,590,271 | B2 | 7/2003 | Liu et al. |
| 6,621,131 | B2 | 9/2003 | Murthy et al. |
| 6,696,341 | B1 * | 2/2004 | Sonoda ................ 438/285 |
| 6,699,764 | B1 | 3/2004 | Tweet et al. |
| 6,774,409 | B2 | 8/2004 | Baba et al. |
| 6,784,101 | B1 | 8/2004 | Yu et al. |
| 6,815,310 | B2 | 11/2004 | Roberds et al. |
| 6,815,735 | B2 | 11/2004 | Inoue et al. |
| 6,821,868 | B2 | 11/2004 | Cheng et al. |
| 6,916,694 | B2 | 7/2005 | Hanafi et al. |
| 2002/0011628 | A1 | 1/2002 | Takagi |
| 2002/0125502 | A1 | 9/2002 | Baba et al. |
| 2003/0052334 | A1 | 3/2003 | Lee et al. |
| 2003/0102490 | A1 | 6/2003 | Kubo et al. |
| 2003/0146473 | A1 | 8/2003 | Inoue et al. |
| 2003/0148584 | A1 | 8/2003 | Roberds et al. |
| 2004/0110336 | A1 | 6/2004 | King |
| 2004/0221792 | A1 | 11/2004 | Forbes |
| 2004/0232422 | A1 * | 11/2004 | Forbes .................. 257/63 |
| 2005/0035470 | A1 | 2/2005 | Ko et al. |
| 2005/0139936 | A1 * | 6/2005 | Li ......................... 257/408 |
| 2005/0145944 | A1 | 7/2005 | Murthy et al. |

FOREIGN PATENT DOCUMENTS

EP  1 020 898 A2  7/2000

OTHER PUBLICATIONS

Inumiya, S., et al., "Fabrication of HfSiON Gate Dielectrics by Plasma Oxidation and Nitridation, Optimized for 65nm node Low Power CMOS Applications," 2003 Symposium on VLSI Technology Digest of Technical Papers, 2 pages, Document No. 4-89114-035-6/03.

Quiñones, E., et al., "Enhanced Mobility PMOSFET's Using Tensile-Strained $Si_{1-y}C_y$ Layers," IEEE Electron Device Letters, Jul. 1999, pp. 338-340, vol. 20, No. 7, IEEE.

Wolf, S., et al., "Silicon Processing for the VLSI Era: vol. 1—Process Technology," 2nd Ed., pp. 338-339, Lettice Press, Sunset Beach, CA, 2000.

King, A.C., et al., "Surface Proximity Effect on End-of-Range Damage of Low Energy Ge$^+$ Implantation," Ultra Shallow Junctions 2003, Seventh International Workshop on: Fabrication, Characterization, and Modeling of Ultra-Shallow Doping Profiles in Semiconductors, Apr. 27-May 1, 2003, pp. 447-450, Santa Cruz, CA, USA.

Straube, U.N., et al., "Adverse Effect of Ge$^+$ Implantation for Fabrication of SiGe PMOS," Electronics Letters, Dec. 6, 2001, pp. 1549-1550, vol. 37, No. 25.

Selvakumar, C.R., et al., "SiGe-Channel n-MOSFET by Germanium Implantation," IEEE Electron Device Letters, Aug. 1991, pp. 444-446, vol. 12, No. 8, IEEE, New York, NY, USA.

Jiang, H., et al., "Electrical Properties of GeSi Surface- and Buried-Channel p-MOSFET's Fabricated by Ge Implantation," IEEE Transactions on Electron Devices, Jan. 1996, pp. 97-103, vol. 43, No. 1, IEEE, New York, NY, USA.

John, S., et al., "Strained Si n-Channel Metal-Oxide-Semiconductor Transistor on Relaxed $Si_{1-x}Ge_x$ Formed by Ion Implantation of Ge," Applied Physics Letters, Apr. 5, 1999, pp. 2076-2078, vol. 74, No. 14, American Institute of Physics, College Park, MD, USA.

Liu, K.C., et al., "A Deep Submicron $Si_{1-x}Ge_x$/Si Vertical PMOSFET Fabricated by Ge Ion Implantation," IEEE Electron Device Letters, Jan. 1998, pp. 13-15, vol. 19, No. 1, IEEE, New York, NY, USA.

Nguyen, N.V., et al., "Characterization of the Interface Between Ge$^+$-Implanted Crystalline Silicon and Its Thermally Grown Oxide by Spectroscopic Ellipsometry," Journal of Applied Physics, Jan. 15, 1990, pp. 599-603, vol. 67, No. 2, American Institute of Physics, College Park, MD, USA.

Höck, G., et al., "High Hole Mobility in $Si_{0.17}Ge_{0.63}$ Channel Metal-Oxide-Semiconductor Field-Effect Transistors Grown by Plasma-Enhanced Chemical Vapor Deposition," Applied Physics Letters, Jun. 26, 2000, pp. 3920-3922, vol. 76, No. 26, American Institute of Physics, College Park, MD, USA.

Shang, H., et al., "High Mobility p-Channel Germanium MOSFETs with a Thin Ge Oxynitride Gate Dielectric," 2002, 0-7803-7463-X/02, IEEE, New York, NY, USA.

Lee, M.L., et al., "Strained Ge Channel p-Type Metal-Oxide-Semiconductor Field-Effect Transistors Grown on $Si_{1-x}G_x$/Si Virtual Substrates," Applied Physics Letters, Nov. 12, 2001, pp. 3344-3346, vol. 79, No. 20, American Institute of Physics, College Park, MD, USA.

Chui, C.O., et al., "Germanium MOS Capacitors Incorporating Ultrathin High-κ Gate Dielectric," IEEE Electron Device Letters, Aug. 2002, pp. 473-475, vol. 23, No. 8, IEEE, New York, NY, USA.

Chui, C.O., et al., "A Sub-400° C. Germanium MOSFET Technology with High-κ Dielectric and Metal Gate," 2002, 0-7803-7463-X/02, IEEE, New York, NY, USA.

Zollner, S., et al., "Optical Constants and Ellipsometric Thickness Determination of Strained $Si_{1-x}Ge_x$:C Layers on Si (100) and Related Heterostructures," Journal of Applied Physics, Oct. 1, 2000, pp. 4102-4108, vol. 88, No. 7, American Institute of Physics, College Park, MD, USA.

Legoues, F.K., et al., "Oxidation Studies of SiGe," Journal of Applied Physics, Feb. 15, 1989, pp. 1724-1728, vol. 65, No. 4, American Institute of Physics, College Park, MD, USA.

Plummer, et al., Silicon VLSE Technology, Fundamentals, Practice and Modeling, 2000, p. 453, Prentice Hall, Upper Saddle River, NJ.

"Front End Processes," International Technology Roadmap for Semiconductor (ITRS), 2002 Update, pp. 45-62, http://member.itrs.net/.

"Front End Processes," International Technology Roadmap for Semiconductor (ITRS), 2003 Edition, pp. 23-25, http://member.itrs.net/.

* cited by examiner

TRANSISTOR WITH SHALLOW GERMANIUM IMPLANTATION REGION IN CHANNEL

This application is a divisional of patent application Ser. No. 10/805,720, entitled "Transistor with Shallow Germanium Implantation Region in Channel," filed on Mar. 22, 2004, now U.S. Pat. No. 7,094,671 which application is incorporated herein by reference.

CROSS-REFERENCE TO RELATED APPLICATIONS

This patent application relates to the following commonly assigned patents: U.S. Pat. No. 7,005,333, filed on Dec. 30, 2003, issued on Feb. 8, 2006 entitled, "Transistor with Silicon and Carbon Layer in the Channel Region;" and U.S. Pat. No. 7,002,224, filed on Feb. 3, 2004, issued on Feb. 1, 2006 entitled, "Transistor with Doped Gate Dielectric," which patents are hereby incorporated herein by reference.

TECHNICAL FIELD

The present invention relates generally to semiconductor devices, and more particularly to a method of fabricating a transistor and a structure thereof.

BACKGROUND

Semiconductor devices are used in a variety of electronic applications, such as personal computers, cell phones, digital cameras, and other electronic equipment, as examples. A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET).

The gate dielectric for MOSFET devices has in the past typically comprised silicon dioxide, which typically has a dielectric constant of 3.9. However, as devices are scaled down in size, using silicon dioxide for a gate dielectric becomes a problem because of gate leakage current, which can degrade device performance. Therefore, there is a trend in the industry towards the development of the use of high dielectric constant (k) materials for use as the gate dielectric in MOSFET devices. The term "high k materials" as used herein refers to a dielectric material having a dielectric constant of 4.0 or greater.

High k gate dielectric development has been identified as one of the future challenges in the 2003 edition of International Technology Roadmap for Semiconductors (ITRS), incorporated herein by reference, which identifies the technological challenges and needs facing the semiconductor industry over the next 15 years. For low power logic (for portable electronic applications, for example), it is important to use devices having low leakage current, in order to extend battery life. Gate leakage current must be controlled in low power applications, as well as sub-threshold leakage, junction leakage, and band-to-band tunneling. For high performance (namely, high speed) applications, it is important to have a low sheet resistance and a minimal effective gate oxide thickness.

To fully realize the benefits of transistor scaling, the gate oxide thickness needs to be scaled down to less than 2 nm. However, the resulting gate leakage current makes the use of such thin oxides impractical in many device applications where low standby power consumption is required. For this reason, the gate oxide dielectric material will eventually be replaced by an alternative dielectric material that has a higher dielectric constant. However, device performance using high k dielectric materials tends to suffer from trapped charge in the dielectric layer, which deteriorates the mobility, making the drive current lower than in transistors having silicon dioxide gate oxides, thus reducing the speed and performance of transistors having high k gate dielectric materials.

FIG. 1 shows a cross-sectional view of a prior art semiconductor device 100 comprising a transistor with a high k gate dielectric material. The semiconductor device 100 includes field oxide regions 104 formed in a workpiece 102. The transistor includes a source S and a drain D that are separated by a channel region C. The transistor includes a gate dielectric 108 that comprises a high k insulating material. A gate 110 is formed over the gate dielectric 108, as shown.

After the gate 110 is formed, the source region S and drain region D are lightly doped, e.g., by a lightly doped drain (LDD) implant, to form extension regions 120 of the source S and drain D. Insulating spacers 112 are then formed along the sidewalls of the gate 110 and gate dielectric 108, and a source/drain implant is performed on exposed surfaces of the workpiece 102, followed by a high temperature thermal anneal, typically at temperatures of about 1000 to 1050° C., to form the source S and drain D.

A problem with the prior art semiconductor device 100 shown in FIG. 1 is that an interfacial oxide 114 is formed between the workpiece 102 and the high k dielectric 108, and an interfacial oxide 116 is formed between the high k dielectric 108 and the gate 110. The interfacial oxides 114 and 116 form because the workpiece 102 typically comprises silicon, which has a strong tendency to form silicon dioxide ($SiO_2$) in the presence of oxygen, during the deposition of the high k gate dielectric 108, for example, forming interfacial oxide 114. Likewise, the gate 110 often comprises polysilicon, which also tends to form an interfacial oxide 116 comprising $SiO_2$ on the top surface of the high k gate dielectric 108.

The source S and drain D regions of the semiconductor device 100 may be made to extend deeper within the workpiece 102 by implanting ions of a dopant species, and annealing the workpiece 102 to cause diffusion of the dopant deep within the workpiece 102, forming the source S and drain D regions. Another problem with the prior art structure 100 is that the high temperature anneal processes used to form the source S and drain D tend to degrade the dielectric constant of the high k gate dielectric 108. In particular, when exposed to a high temperature treatment, the interfacial oxides 114 and 116 become thicker, increasing the effective oxide thickness (EOT) 118 evaluated electrically from the entire gate stack (the interfacial oxide 114, high k dielectric 108 and interfacial oxide 116) of the semiconductor device 100. Thus, by using a high k dielectric material for the gate dielectric 108, it can be difficult to decrease the gate dielectric 108 thickness to a dimension required for the transistor design, as devices 100 are scaled down in size.

Therefore, what is needed in the art is a transistor design and fabrication method having a high k dielectric material, wherein the effective gate dielectric thickness is reduced.

Another challenge in the scaling of transistors is increasing the mobility in the channel region, which increases the speed of the device. Thus, what is also needed in the art is a transistor design and fabrication method wherein mobility in the channel region is increased.

SUMMARY OF THE INVENTION

These and other problems are generally solved or circumvented, and technical advantages are generally achieved, by preferred embodiments of the present invention, which includes a transistor and method of fabrication thereof, having a channel region with a very shallow high concentration of germanium implanted therein. A low-temperature anneal process is used to re-crystallize the germanium implantation region in the channel region and eliminate defects or damage caused by the implantation process. A gate dielectric material is formed over the channel region, before or after the low-temperature anneal process, and a gate is formed over the high-k gate dielectric. Source and drain regions are formed by implanting dopants and using a low-temperature anneal process to drive in the dopants. Due to the presence of a high concentration of germanium at the top surface of the channel, and because of the low-temperature anneal processes used in accordance with embodiments of the present invention, the effective oxide thickness of the gate dielectric is kept to a minimum, resulting in a thinner effective gate dielectric (or oxide) thickness. The implanted germanium also increases the mobility of the channel region due to the strain in the channel region caused by the size misfit between silicon atoms and germanium atoms. For example, germanium atoms are larger than silicon atoms, so when germanium is introduced into a silicon atomic lattice structure, the larger germanium atoms create stress in the atomic structure in the channel region.

In accordance with a preferred embodiment of the present invention, a transistor includes a workpiece, the workpiece comprising a top surface, and a crystalline implantation region disposed within the workpiece, the implantation region comprising germanium, wherein the crystalline implantation region extends within the workpiece from the top surface of the workpiece by about 120 Å or less. A gate dielectric is disposed over the implantation region, and a gate is disposed over the gate dielectric. The transistor includes a source region and a drain region formed in at least the crystalline implantation region within the workpiece.

In accordance with another preferred embodiment of the present invention, a method of fabricating a transistor includes providing a workpiece, the workpiece having a top surface, and implanting germanium into the top surface of the workpiece, forming a first germanium-containing region within the top surface of the workpiece and forming a second germanium-containing region beneath the first germanium-containing region. The first germanium-containing region extends a first depth beneath the workpiece top surface, and the second germanium-containing region extends a second depth below the first depth. The first and second depth comprise about 100 Å or less below the top surface of the workpiece. The method includes depositing a gate dielectric material over the first germanium-containing region, depositing a gate material over the gate dielectric material, and patterning the gate material and gate dielectric material to form a gate and a gate dielectric over the first germanium-containing region. A source region and a drain region are formed in at least the first germanium-containing region.

In accordance with yet another preferred embodiment of the present invention, a method of fabricating a transistor includes providing a workpiece, the workpiece having a top surface, and implanting germanium into the top surface of the workpiece, forming an amorphous germanium-containing region within the top surface of the workpiece, the amorphous germanium-containing region extending about 45 Å or less beneath the workpiece top surface, and also forming a first crystalline germanium-containing region beneath the amorphous germanium-containing region, the first crystalline germanium-containing region extending about 55 Å or less beneath the amorphous germanium-containing region. A gate dielectric material is deposited over the amorphous germanium-containing region, the gate dielectric material having a dielectric constant of about 4.0 or greater. The workpiece is annealed at a temperature of about 750° C. or less for about 60 minutes or less, re-crystallizing the amorphous germanium-containing region and forming a single second crystalline germanium-containing region within the top surface of the workpiece, the single second crystalline germanium-containing region comprising the re-crystallized amorphous germanium-containing region and the first crystalline germanium-containing region, the second crystalline germanium-containing region extending about 120 Å or less beneath the workpiece top surface. A gate material is deposited over the gate dielectric material, and the gate material and the gate dielectric material are patterned to form a gate and a gate dielectric over the second crystalline germanium-containing region. A source region and a drain region are formed in at least the second crystalline germanium-containing region.

Advantages of preferred embodiments of the present invention include providing a transistor design and manufacturing method thereof, wherein the total anneal temperature for the transistor manufacturing process flow is reduced, reducing the thermal budget and improving the gate dielectric quality. Because of the presence of germanium in the workpiece, and because the anneal process to re-crystallize the amorphous germanium-containing region comprises a low temperature, the effective gate oxide thickness is kept to a minimum. The germanium in the channel region increases the mobility of holes and electrons in the channel region, resulting in a transistor device with a faster response time and increased drive current.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 6 through 8 show cross-sectional views of another embodiment of the present invention, wherein the gate dielectric material is deposited before the low temperature anneal to re-crystallize the amorphous germanium-containing region at the top surface of the workpiece, and wherein FIG. 7 is an enlarged view of the channel region shown in FIG. 6.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
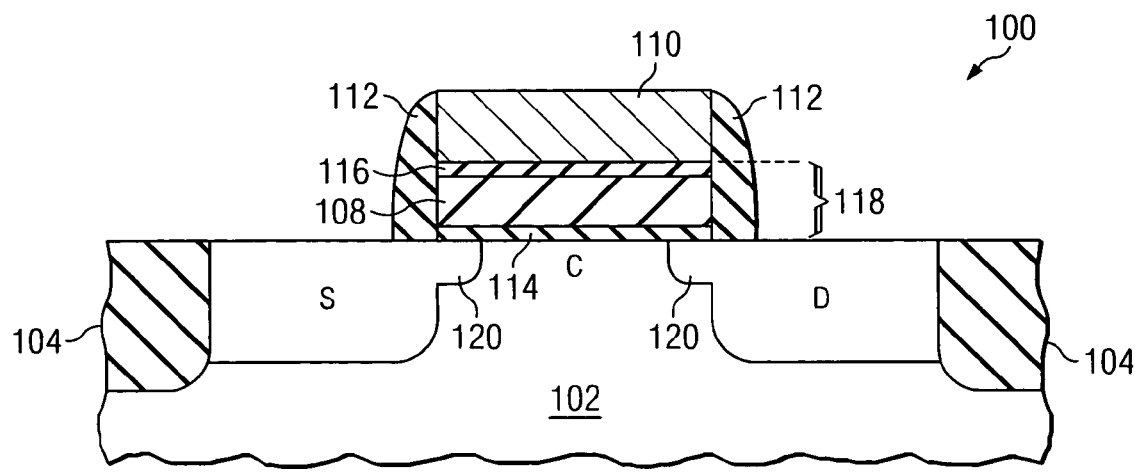
FIG. 1 shows a cross-sectional view of a prior art transistor.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a transistor formed on a semiconductor device. The invention may also be applied, however, to MOSFETs or other transistor devices, including p channel metal oxide semiconductor (PMOS) transistors, n channel metal oxide semiconductor (NMOS) transistors, and/or complimentary metal oxide semiconductor (CMOS) devices, as examples. Only one transistor is shown in each of the figures; however, there may be many other transistors and devices formed in the manufacturing process for the semiconductor devices shown.

The use of germanium in a channel region of a transistor is desired, because germanium creates strain in the channel due to the lattice mis-match between silicon and germanium, having a potential to increase the mobility of holes and electrons in a transistor. However, there have been problems and challenges in introducing germanium into channel regions of transistors, which will be discussed next herein.

Introducing germanium into a channel region by epitaxial growth of Si and Ge is disclosed in commonly assigned U.S. patent application, Ser. No. 10/748,995, filed on Dec. 30, 2003, entitled "Transistor with Silicon and Carbon Layer in the Channel Region," which is incorporated herein by reference. However, growing an epitaxial layer in the channel region requires an additional deposition step in the manufacturing process flow of a transistor, which increases the manufacturing costs, and is thus undesirable.

Attempts have been made in the past to implant germanium into the channel region of a transistor. However, implanting germanium in a substrate results in defects being formed, which causes leakage current in the transistor. In the past, the implantation of germanium was at an energy level of 30 keV to 200 keV with dose ranges from $1 \times 10^{15}$ to $1 \times 10^{17}$ atoms/cm$^2$, resulting in (after thermal processing) a final channel composition of SiGe$_x$ with x<0.16. According to Plummer et al. in Silicon VLSE Technology, Fundamentals, Practice and Modeling, 2000, Prentice Hall, Upper Saddle River, N.J., at p. 453, which is incorporated herein by reference, the distribution of the implanted ions is often modeled to the first order by a Gaussian distribution given by Equation 1, below.

Equation 1:
$$C(x) = C_p \exp\left(-\frac{(x - R_p)^2}{2\Delta R_p^2}\right);$$

where $R_p$ is the average projected range normal to the surface, $\Delta R_p$ is the standard deviation or straggle about that range, and $C_p$ is the peak concentration where the Gaussian is centered. In general, the peak concentration, $C_p$, is inverse proportional to the straggle, $\Delta R_p$, and the $R_p$ and $\Delta R_p$ are monotonically changed with the implant energy. To implant Ge with the previous mentioned energy range, the ($R_p$, $\Delta R_p$) range from (255 Å, 55 Å) to (1233 Å, 322 Å). This implantation of germanium causes damage to the substrate, creating leakage paths in the channel region, and causing high drain to substrate leakage current, low breakdown voltages and reduced drain current for the transistor. In addition, end-of-range (EOR) defects form below an amorphous/crystalline interface after the implant, and those defects are difficult to anneal out, even using a higher temperature process. These defects will cause source to drain leakage and "off state" leakage in the channel region of a transistor, degrading device performance.

As mentioned above, by having Ge in the Si lattice, forming a SiGe$_x$ layer, channel mobility will be increased. The higher the Ge content, the higher the mobility improvement. To increase the Ge content in this implant scheme, either the energy of the implant needs to be decreased, or dose of the implant needs to be increased. However, in a lower energy conditions, the depth of the EOR will be also shallower and close to the active channel region, which will make the leakage problem more severe.

Because the end-of-range defects cannot be easily removed, attempts have been made to lower the amorphous/crystalline interface deeper into the substrate, e.g., to a depth of 1 μm or greater, in an attempt to avoid increasing the leakage current. That process requires an even larger implant energy (500 keV or larger) and because more complex defects are generated near the surface, makes this process not effective. Therefore, this implant scheme to form a SiGe$_x$ layer is not preferable in semiconductor industry, and instead, the mainstream technique of introducing germanium into a channel region is by using a CVD (Chemical Vapor Deposition) method to deposit SiGe$_x$ on top of a Si substrate.

In a paper entitled, "Surface Proximity Effect on End-of Range Damage of Low Energy Ge Implantation" by King et al., presented at the Ultra Shallow Junctions (USJ) 2003 Conference, pp. 447-450, which is incorporated herein by reference, germanium was implanted into a silicon substrate using an energy of 10 keV at a concentration of $1 \times 10^{15}$ atoms/cm$^2$, and a portion of the implanted germanium layer was mechanically thinned by lapping. According to the authors, a lapped substrate having an amorphous/crystalline interface at a depth of 45 Å resulted in no end-of-range defects being formed during an anneal process. The surface proximity, e.g., implanting the germanium at a depth close to the surface of the substrate, resulted in subsequent annihilation of defects upon annealing.

Embodiments of the present invention achieve technical advantages by providing a novel method of manufacturing a transistor, wherein a very shallow region of germanium is introduced into a channel region of a transistor, without requiring an additional deposition or epitaxial growth process, and also avoiding increasing the leakage current of the transistor. Germanium is implanted in a shallow top region of a workpiece in a channel region of the transistor, at a depth of about 45 Å or less. The germanium is implanted using a low energy level and at a high concentration dose, creating an initially amorphous region of germanium, after the implant. The amorphous germanium implantation region is annealed using a low-temperature anneal to convert the amorphous germanium region implanted to a crystalline state while preventing a substantial amount of diffusion of germanium further into the workpiece, and also removing damage to the workpiece that may have been caused by the low energy, high dopant concentration shallow implant. The resulting structure includes a crystalline germanium implantation region at the top surface of a channel, comprising a depth below the top surface of the workpiece of about 120 Å or less. An interfacial oxide formed between the germanium-implanted workpiece and the gate dielectric has a minimal thickness, resulting in a lower electrical effective gate oxide thickness (EOT). The shallow germanium region in the channel of the transistor increases the hole and electron mobility.

Figure 2:
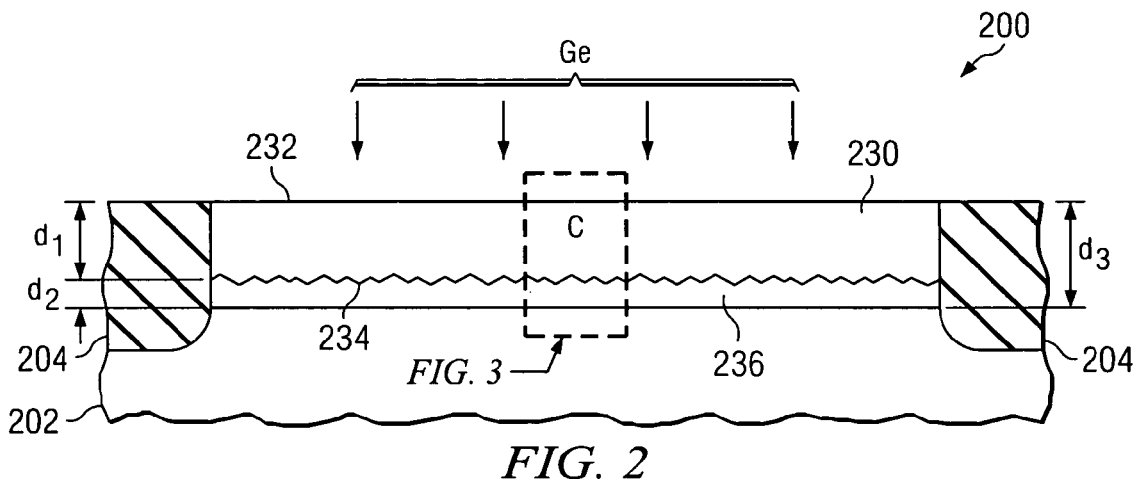
FIGS. 2 through 5 show cross-sectional views of a transistor at various stages of manufacturing in accordance with a preferred embodiment of the present invention, with FIG. 3 being an enlarged view of the channel region in FIG. 2, wherein a channel region of a transistor is implanted at a low energy with a high concentration of germanium, followed by a low temperature anneal process.

FIGS. 2 through 5 show cross-sectional views of a preferred embodiment of the present invention at various stages of manufacturing. Referring first to FIG. 2, a semiconductor device 200 comprises a workpiece 202. The workpiece 202 may include a semiconductor substrate comprising silicon or other semiconductor materials covered by an insulating layer, for example. The workpiece 202 may also include other active components or circuits, not shown. The workpiece 202 may comprise silicon oxide over single-crystal silicon, for example. The workpiece 202 may include other conductive layers or other semiconductor elements, e.g., transistors, diodes, etc. The workpiece 202 may also comprise a silicon-on-insulator (SOI) substrate, for example.

The workpiece 202 may be lightly doped (not shown). In general, the workpiece 202 is doped with the either N or P type dopants, depending on whether the junctions of the transistor to be formed will be P or N type, respectively. For example, if the transistors to be manufactured comprise PMOS transistors, the workpiece 202 may be lightly doped with N type dopants. Or, if NMOS transistors will be formed, the workpiece 202 may be lightly doped with P type dopants.

Isolation regions 204 may be formed in various locations on the workpiece 202, as shown. The isolation regions 204 may comprise shallow trench isolation (STI) regions or field oxide regions that are disposed on either side of a channel region C of a transistor 250 (not shown in FIG. 2; see FIG. 5), for example. The isolation regions 204 may be formed by depositing a photoresist over the workpiece 202, not shown. The photoresist may be patterned using lithography techniques, and the photoresist may be used as a mask while the workpiece 202 is etched to form holes or patterns for the isolation regions 204 in a top surface of the workpiece 202. An insulator such as an oxide, for example, may be deposited over the workpiece 202 to fill the patterns, forming isolation regions 204. Alternatively, the isolation regions 204 may be formed by other methods and may comprise other insulating materials, for example.

Note that if PMOS and NMOS transistors (not shown) are to be manufactured on the same workpiece 202, the workpiece 202 may be lightly doped with P type dopants, the NMOS portions of the workpiece 202 may be masked, and well implants may then be formed to create N wells for the PMOS devices. P type implants may then be implanted into the NMOS portions.

The exposed portions of the workpiece 202 are subjected to a pre-gate cleaning process to remove any native oxides or other debris or contaminants from the top surface of the workpiece 202. The pre-gate treatment may comprise a HF, HCl or ozone based cleaning treatment, as examples, although the pre-gate treatment may alternatively comprise other chemistries.

Next, germanium is implanted into a shallow top region of the exposed regions of the workpiece 202, in particular in a channel region C of a transistor, as shown in FIG. 2. Germanium atoms are preferably implanted using a low energy implant, preferably at an energy level of about 5 keV or less for a time period of about 3 to 30 minutes per wafer or workpiece (for example, in a batch tool that handles X number of wafers, the time period for the low energy implant would be (3 to 30 minutes)×X). The implantation dose is preferably targeted at the surface 232 of the workpiece 202, and comprises a high dose, preferably about $1\times10^{15}$ to $1\times10^{17}$ atoms/cm$^2$ of germanium, for example.

The germanium implantation step results in the formation of an amorphous germanium implantation region 230 (also referred to herein as an amorphous germanium-containing region) proximate the top surface 232 of the workpiece 202, and a crystalline germanium implantation region 236 (also referred to herein as a crystalline germanium-containing region) disposed beneath the amorphous germanium implantation region 230. The amorphous germanium implantation region 230 preferably comprises a depth $d_1$ of about 45 Å or less beneath the top surface 232 of the workpiece 202, for example. The crystalline germanium implantation region 236 preferably comprises a depth $d_2$ of about 55 Å or less beneath the amorphous germanium implantation region 230. The total depth $d_3$ of the crystalline germanium implantation region 236 and the amorphous germanium implantation region 230 preferably comprises a depth of about 100 Å or less, for example.

The amorphous germanium implantation region 230 and the crystalline germanium implantation region 236 may be separated by a damage region 234 as a result of the implantation process. Implantation involves bombardment of the workpiece 202 by atoms (in this case, germanium atoms), which can result in physical damage within the workpiece 202. Because the damage region 234 is located close to the top surface 232 of the workpiece 202, the damage region 234 will be repaired or annihilated in a subsequent low-temperature anneal step, to be described further herein.

Figure 3:
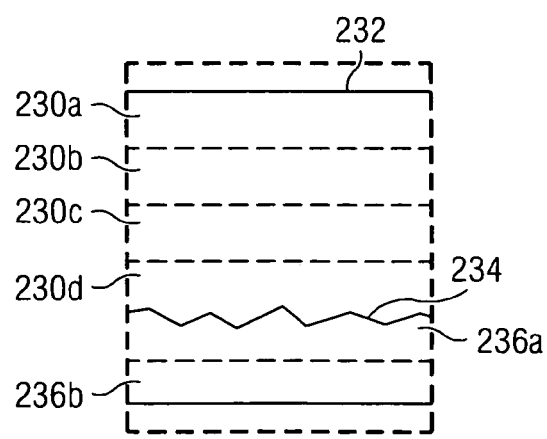

The germanium implantation process results in a Gaussian distribution (e.g., a distribution appearing similar to one side of a Bell curve) of germanium ions implanted within the top surface 232 of the workpiece 202, as shown in greater detail in FIG. 3. The concentration of germanium is preferably higher at an upper level 230a than at each subsequent lower level 230b, 230c, 230d, 236a, 236b beneath the top surface 232 of the workpiece 202. The concentration of germanium in a top portion 230 near the top surface 232 of the workpiece 202 may comprise about 50% or greater of germanium and about 50% or less of silicon, as an example. The dopant concentration of germanium at upper portions of the amorphous germanium implantation region 230a and 230b may comprise on the order of about $1\times10^{18}$ to $5\times10^{23}$ atoms/cm$^3$, as examples. The dopant concentration of germanium at lower portions of the crystalline germanium implantation region 236b may comprise a concentration of about $1\times10^{17}$ or less, for example. The dopant concentration of germanium after the low energy shallow implant preferably results in the highest concentration of germanium dopants near the top surface 232 of the workpiece 202, with the germanium dopant concentration being gradually less extending downward through the workpiece 202.

In one embodiment, the top portion 230a of the amorphous germanium implantation region preferably comprises substantially 100% germanium. This embodiment is particularly effective in reducing the electrical effective oxide thickness of the transistor, to be described further herein.

Note that preferably, a sacrificial oxide is not deposited over the workpiece 202 before implanting the germanium, as is sometimes used in ion implantation processes. By not using a sacrificial oxide, a higher concentration of germanium may be implanted, in accordance with preferred embodiments of the present invention. In particular, higher concentrations of germanium may be implanted at low energy levels of 5 keV or less, if a sacrificial oxide is not used. Using a sacrificial oxide would require a higher energy level to achieve the germanium implantation, and a low energy level implant is desired to achieve the shallow implant of about 100 Å or less.

Furthermore, in accordance with embodiments of the present invention, the workpiece 202 is preferably not exposed to a temperature of over about 938.3° C. after the germanium is implanted into the shallow top region of the workpiece 202, which is the melting point of germanium. Heating the workpiece 202 to a temperature over about 938.3° C. would deleteriously affect the transistor performance. Furthermore, preferably the workpiece 202 is not heated to a temperature of greater than about 750° C. for extended periods of time after the germanium implant and before the gate dielectric material deposition, to avoid causing excessive diffusion of germanium further into the workpiece 202.

Figure 4:
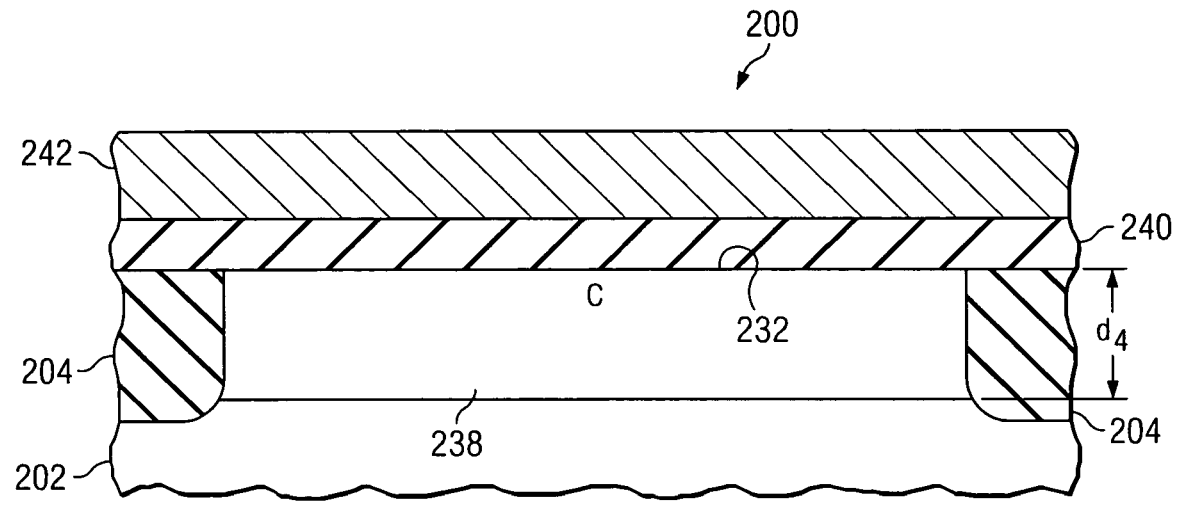

Next, the workpiece 202 is subjected to a low temperature anneal process, e.g., at a temperature of about 750° C. or less for about 60 minutes or less, for example. The low temperature anneal process may comprise a solid phase epitaxial regrowth (SPER) process, for example. The low temperature anneal process causes the amorphous germanium implantation region 230 to re-crystallize (e.g., the top region of the workpiece where the amorphous germanium implantation region 230 now resides was crystalline prior to the implantation of the germanium), and also repairs the damaged region 234, resulting in a single crystalline germanium implantation region 238 having a depth $d_4$ beneath the top surface 232 of the workpiece, as shown in FIG. 4. The single crystalline germanium implantation region 238 comprises the re-crystallized amorphous germanium implantation region 230 and the crystalline germanium implantation region 236. The total depth $d_3$ of the amorphous germanium-containing region 230 and crystalline germanium-containing region 236 of FIG. 2 may be increased by about 20 Å or less to a depth $d_4$ of about 120 Å or less during the low temperature anneal process, caused by diffusion of germanium downwards into the workpiece 202. Advantageously, because the anneal process to re-crystallize the amorphous implantation region 230 and repair the damaged region 234 is at a low temperature, the depth $d_4$ is not increased much (e.g., only about 20 Å or less) during the low temperature anneal process.

Regions of the workpiece 202 (not shown) may then be implanted for a $V_T$ threshold voltage, for example. An anti-punch-through implant may then be performed on portions of the workpiece 202, also not shown. Alternatively, the $V_T$ and anti-punch-through implants may be performed on the workpiece 202 before the germanium implant, in accordance with a preferred embodiment of the present invention. The workpiece 202 may then be exposed to another pre-gate cleaning or treatment comprising a HF, HCl or ozone based cleaning treatment, as examples, to remove any particulates, contaminates, or native oxide particles disposed on the germanium implantation region 238 in the channel region C, for example.

A gate dielectric material 240 is deposited over the workpiece 202, as shown in FIG. 4. The gate dielectric material 240 may be also deposited before annealing the workpiece, to be described herein with reference to FIGS. 6-8. Referring again to FIG. 4, in one embodiment, the gate dielectric material 240 preferably comprises a high k material having a dielectric constant of 4.0 or greater. In this embodiment, the gate dielectric material 240 preferably comprises $HfO_2$, $HfSiO_X$, $Al_2O_3$, $ZrO_2$, $ZrSiO_X$, $Ta_2O_5$, $La_2O_3$, $Si_xN_y$ or SiON, as examples, although alternatively, the gate dielectric material 240 may comprise other high k insulating materials. The gate dielectric material 240 may comprise a single layer of material, or alternatively, the gate dielectric material 240 may comprise two or more layers. In one embodiment, one or more of these materials can be included in the gate dielectric material 240 in different combinations or in stacked layers. The gate dielectric material 240 may be deposited by chemical vapor deposition (CVD), atomic layer deposition (ALD), metal organic chemical vapor deposition (MOCVD), physical vapor deposition (PVD), or jet vapor deposition (JVP), as examples, although alternatively, the gate dielectric material 240 may be deposited using other suitable deposition techniques. The gate dielectric material 240 preferably comprises a thickness of about 10 Å to about 60 Å in one embodiment, although alternatively, the gate dielectric material 240 may comprise other dimensions, such as 80 Å or less, as an example.

Embodiments of the present invention are particularly advantageous when used in transistor designs having high dielectric constant materials for the gate dielectric material 240, because a concern with high dielectric constant gate materials is reducing the effective gate oxide thickness, which advantageously is reduced by embodiments of the present invention. Furthermore, transistors having high-k gate dielectrics typically have lower electron and hole mobility than transistors utilizing more traditional gate dielectric materials, such as $SiO_2$ or SiON, and thus, this is another reason that embodiments of the invention are advantageous for use with high k gate dielectric materials. However, embodiments of the present invention also have useful application in transistor designs having more traditional gate dielectric materials, such as $SiO_2$ or SiON, as examples.

A gate material 242 is deposited over the gate dielectric material 240. The gate material 242 preferably comprises a conductor, such as a metal or polysilicon, although alternatively, other conductive and semiconductive materials may be used for the gate material 242. For example, the gate material 242 may comprise TiN, HfN, TaN, a fully silicided gate material (FUSI), or other metals, as examples. The gate material 242 may comprise a plurality of stacked gate materials, such as a metal underlayer with a polysilicon cap layer disposed over the metal underlayer, or a combination of a plurality of metal layers that form a gate electrode stack. Alternatively, in another embodiment, the gate material 242 may comprise polysilicon or other semiconductor materials. The gate material 242 may be deposited using CVD, PVD, ALD, or other deposition techniques, as examples. The gate material 242 preferably comprises a thickness of about 1500 Å, although alternatively, the gate material 242 may comprise about 1000 Å to about 2000 Å, or other dimensions, for example.

Figure 5:
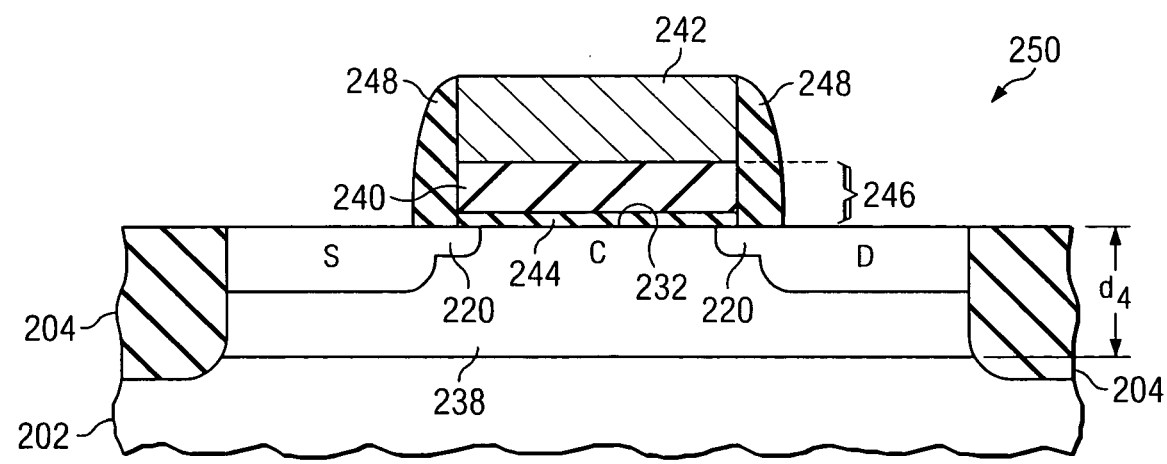

The gate material 242 and the gate dielectric material 240 are patterned using a lithography technique to form a gate 242 and a gate dielectric 240 of a transistor, as shown in FIG. 5. For example, a photoresist (not shown) may be deposited over the workpiece 202. The photoresist may be patterned with a desired pattern for the gate and gate dielectric, and the photoresist may be used as a mask while the gate material 242 and the gate dielectric material 240 are etched to form the gate material 242 and gate dielectric material 240 into the desired pattern. The photoresist is then stripped or removed.

Note that a thin interfacial layer 244 is likely to be formed during the deposition of the gate dielectric material 240, or during a cleaning treatment such as a wet pre-clean, prior to the gate dielectric material 240 deposition, as examples. This thin interfacial layer 244 typically comprises a thickness of about 7 Å or less. The thin interfacial layer 244 forms by the reaction of silicon or other semiconductor material in the workpiece 202 with an oxide in the gate dielectric material 240 or pre-clean process. Advantageously, the thickness of the thin interfacial layer 244 is minimized by the presence of germanium (e.g., at 230a) in the top surface of the workpiece 202, and also because only low temperature anneal processes are used in the manufacturing process from this point forward. A thin interfacial layer may also be formed between the gate 242 and the gate dielectric 240 (not shown in FIG. 5; see FIG. 8).

Next, in accordance with a preferred embodiment of the present invention, a source region S and drain region D are then formed proximate the channel region C, as shown in FIG. 5. More particularly, the source region S and the drain region D are preferably formed in at least the crystalline germanium implantation region 238, as shown. For example, the source region S and the drain region D may also extend through the crystalline germanium implantation region 238 into the workpiece 202 below the crystalline germanium implantation region 238 (not shown). The source region S and drain region D may be formed using an optional extension implant, which may comprise implanting dopants using a low energy implant at about 200 eV to 1 keV, for example, to form extension regions 220. A spacer material such as silicon nitride or other insulator, as examples, is deposited over the entire workpiece 202, and then the spacer material is etched using an etch process such as an anisotropic etch, leaving the spacers 248 disposed over sidewalls of the gate dielectric 240 and gate 242, as shown. Alternatively, the spacers 248 may be more rectangular-shaped and may be patterned using a photoresist as a mask, as an example, not shown.

To complete the implantation of the source S and drain D regions, a second dopant implantation process is then performed on exposed portions of the germanium implantation region 238, preferably using a slightly higher energy implantation process than was used for the extension regions 220. For example, the second implantation process may be at about 5 keV to 20 keV. A low-temperature temperature anneal may then be performed to drive in and activate the dopant of the extension regions 220 and the source S and drain D regions. The low-temperature anneal is preferably performed at a temperature of less than 938.3° C. to avoid damaging the germanium in the germanium implantation region 238, for example.

The doped regions of the source S and drain D and extension regions 220 extend beneath the spacers 248 and also extend laterally beneath the gate 242 and gate dielectric 240 by about 100 Å or less, as shown in FIG. 5. The low-temperature anneal process to form the source S and drain D preferably comprises a temperature of about 938.3° C. or less for about 1 hour or less, and more preferably comprises a temperature of about 900° C. or less for about 20 minutes or less, as examples. The doped regions of the source S and drain D preferably comprise a thickness of about 100 Å or less.

The manufacturing process for the device 200 is then continued to complete the device 200, preferably without subjecting the semiconductor device 200 to high temperatures, e.g., preferably without exposing the semiconductor device 200 to a temperature greater than about 938.3° C.

Thus, in accordance with an embodiment of the invention, a transistor 250 is formed that includes a gate 242, a source S and a drain D, wherein the transistor 250 channel region C comprises a shallow crystalline germanium implantation region 238 formed therein. The germanium implantation region 238 in the channel region C increases the mobility of the transistor device 250. The transistor device 250 has a thin effective oxide thickness 246 which includes the interfacial layer 244, the high k gate dielectric 240, and a thin interfacial layer between the gate 242 and gate dielectric 240, if present, not shown. Advantageously, because the transistor 250 is not exposed to a high-temperature anneal process, e.g., temperatures of 938.3° C. or greater, increasing the thickness of the interfacial layer 244 is avoided, thus decreasing the effective oxide thickness 246. For example, the interfacial layer 244 preferably comprises a thickness of about 2 Å to about 7 Å, and more preferably comprises a thickness of about 7 Å or less. The transistor 250 is particularly advantageous in applications wherein a high drive current and minimal effective oxide thickness are important, such as in high performance (e.g., high speed) applications, for example, in use with memory and other devices.

The germanium implantation of the channel region particularly enhances performance of devices with high-k gate stack Ge oxides (such as $GeO_2$ or GeO), which are unstable as compared to Si oxides. By having Ge at the workpiece 232 surface, the bottom interfacial layer 244, which primarily comprises Si oxide, between Si substrate 238 and high-k dielectric 240 is reduced in thickness and hence, a smaller EOT is achievable for the transistor device 250, which is advantageous in both low power and high performance applications. In addition, Ge segregates near the workpiece top surface 232, proximate the interfacial oxide 244 comprising Si oxides, forming a high Ge content region at the interface (e.g., at 230a in FIG. 3). This further enhances the channel mobility of the transistor device 250. For these reasons, the Ge channel implant process described herein is particularly advantageous in high-k gate stack 240 applications.

Figure 6:
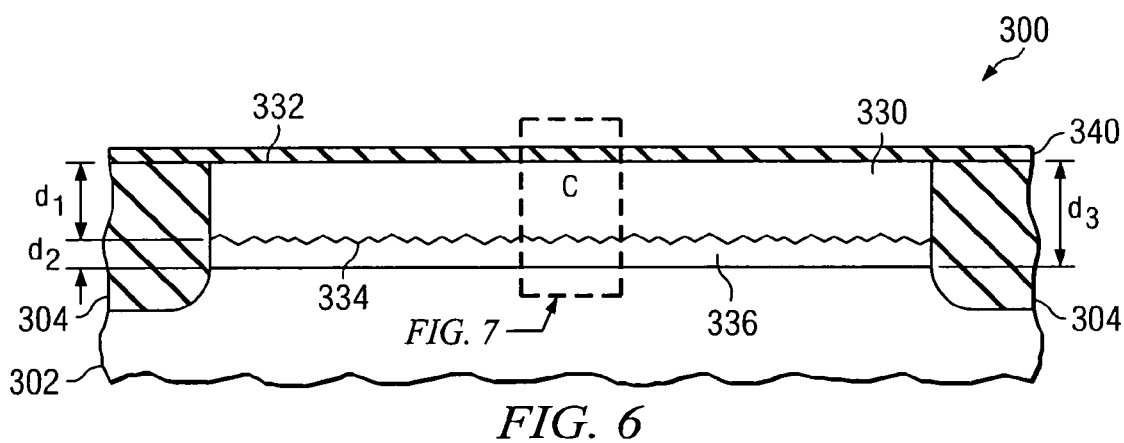
Figure 7:
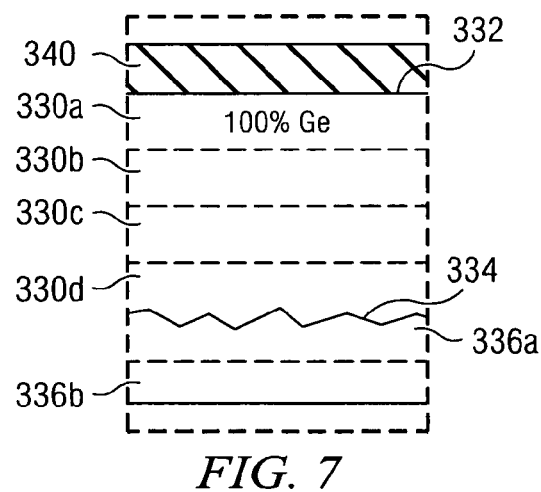
Figure 8:
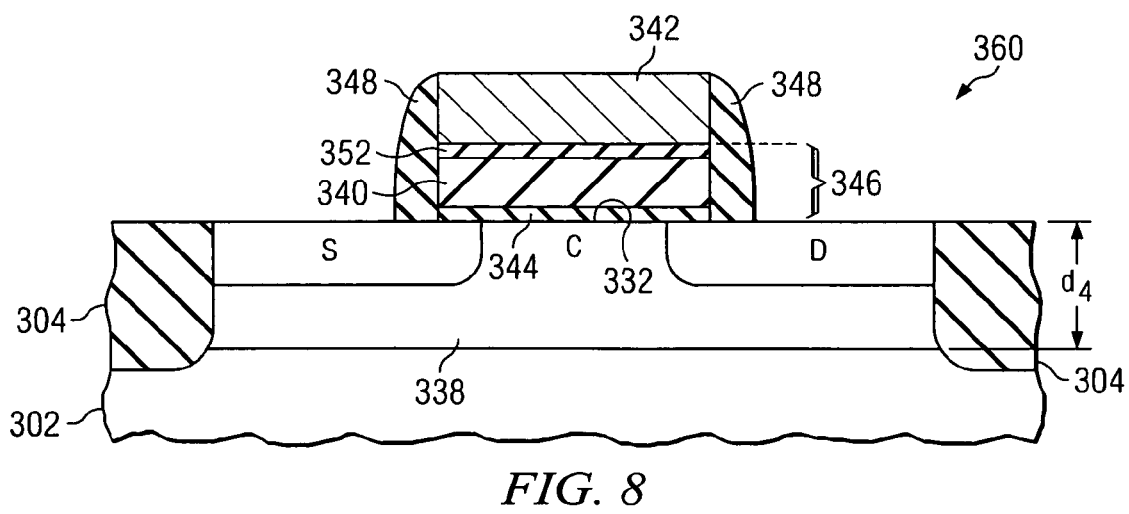

FIGS. 6 through 8 show cross-sectional views of another embodiment of the present invention, in which a similar process flow may be used as was described for FIGS. 2 through 5. Similar reference numbers are designated for the various elements in FIGS. 6 through 8 as were used in FIGS. 2 through 5. To avoid repetition, each reference number shown in the figure is not described again in detail herein. Rather, similar materials and thicknesses described for x02, x04, etc . . . are preferably used for the material layers shown as were described for FIGS. 2 through 5, where x=2 in FIGS. 2 through 5 and x=3 in FIGS. 6 through 8. As an example, the preferred and alternative materials listed for the high k gate dielectric material 240 in the description for FIGS. 2 through 5 are preferably also used for the high k gate dielectric material 340 in FIGS. 6 through 8.

As shown in FIG. 6, in this embodiment, the gate dielectric material 340 is deposited before the low-temperature anneal process, immediately after the shallow implantation process to form the amorphous germanium implantation region 330 proximate the top surface 332 of the workpiece 302, and a crystalline germanium implantation region 336 disposed beneath the amorphous germanium implantation region 330. An advantage of this embodiment is that Ge is maintained at the maximum level because Ge out-diffusion is blocked by the gate dielectric 340. The gate dielectric 240 functions as a cap layer during the low temperature anneal process, in this embodiment. For example, in the embodiment shown in FIGS. 2 through 5, in the low temperature anneal process after implanting germanium, Ge may out-diffuse upwards into the ambient (e.g., it may evaporate). However, by having the gate dielectric 340 disposed over the workpiece top surface 332 during the low-temperature anneal, Ge is prevented from leaving from the top surface 332 of the workpiece 302. FIG. 7 shows a more detailed view of the channel region C of FIG. 6.

Note than in accordance with embodiments of the present invention, the top portion 330a of the amorphous germanium implantation region 330 may advantageously comprise substantially 100% germanium. This is advantageous because germanium oxide (GeO2) is not stable and does not have a strong tendency to form, as does SiO2. Therefore, by having a top layer 330a of 100% germanium, the thickness of interfacial oxide 344 formed is minimal, e.g., 4 Å or less, shown in FIG. 8, and alternatively, no interfacial oxide 344 may be formed at all between the high k gate dielectric 340 and the germanium implantation region 338 (not shown in the figures). Note that an interfacial oxide 352 may also be formed between high k gate dielectric 340 and the gate electrode 342, as shown in FIG. 8. Note also that the transistor 360 may not include shallow extension regions in the source S and drain D regions, but rather, the source S and drain D region may comprise an extension region that extends laterally beneath a portion of the gate dielectric 340 and the gate electrode 342.

Experimental Results

Experiments show that a low energy shallow implant of germanium in a channel region of a transistor device having a high k dielectric result in transistors having increased transconductance and increased saturation current, indicating that the transistors have increased mobility in the channel region. The transistors also had a measurable lower EOT.

Experimental results of implementing embodiments of the present invention will next be described, with the manufacturing steps being listed sequentially, and with reference to FIGS. 6-8. CMOS devices comprising NMOS and PMOS transistors having germanium-implanted channel regions were fabricated. A control wafer was also fabricated, using the same materials, dimensions, and manufacturing processes, but not having a germanium implant in the channel region. Germanium was implanted into the top surfaces 332 of workpieces 302 of the experimental wafers at energy levels ranging from 0.5 keV to 4 keV at doses ranging from $5\times10^{15}$ to $1\times10^{16}$ Ge atoms/cm$^2$. A gate dielectric 340 comprising 45 Å of 20% HfSiOx (20SiO$_2$ and 80% HfO$_2$) was deposited over the workpieces 302. The workpieces 302 were annealed at 700° C. in a NH$_3$ ambient for 60 seconds. A gate material 342 comprising 100 Å of TiN and a subsequently-deposited 1800 Å layer of polysilicon was formed over the gate dielectric 340. The gate material 342 and the gate dielectric 340 were patterned to form a gate 342 and gate dielectric 340. Source and drain regions S/D were formed by implanting As for the NMOS devices, and by implanting BF$_2$ for the PMOS devices, and annealing the workpieces 302 at 900° C. for 60 seconds.

The electrical performance of transistors 360 having germanium implanted in the channel region C was compared to transistors having no germanium implant in the channel region. The electrical effective oxide thickness (EOT) of transistors 360 having a shallow germanium implant in the channel was lower on average by about 10%, and was lower by 1.1 Å in one instance than the control wafer. The saturation current and transconductance were higher in the Ge-implanted wafers than in the control wafers by about 20%. For example, the saturation current of one Ge-implanted wafer was 5.175 μamperes/μm, compared to 4.525 μamperes/μm for the control wafer. The transconductance was 17.5 μSiemens/μm of one Ge-implanted wafer, compared to 16.2 μSiemens/μm for the control wafer. The electron mobility of Ge wafers was slightly higher for the control wafer, by about 5%. As an example, the mobility was 89.6 cm$^2$/voltage-seconds for one Ge-implanted wafer and the mobility was 86.1 cm$^2$/voltage-seconds for the control wafer. Optimal performance of germanium-implanted channel transistors 360 was seen when the germanium implantation process comprised 2 keV at a dose of $1\times10^{16}$ atoms/cm$^2$ germanium.

Note that in the experimental results described herein, the anneal was performed in an ammonia ambient, however, in a preferred embodiment, the low energy germanium implantation process comprises other ambient gases such as N$_2$.

The order of the manufacturing process steps described herein may be altered. For example, in a preferred embodiment, the workpiece is preferably subjected to a pre-gate clean immediately before the germanium implant, to minimize the amount of native oxide present on the workpiece surface prior to the germanium implant, thus increasing the concentration of germanium implanted in the top surface of the workpiece. Alternatively, the pre-gate clean may be performed at other stages in the manufacturing process. In one preferred embodiment, the process steps are completed in the following order: form field oxide regions 204 in a workpiece 202, implant $V_T$ implants, implant anti-punch-through implants, pre-gate clean, implant shallow germanium regions in channel region C as described herein, deposit gate dielectric 240/340, low-temperature anneal, deposit gate material 242/342, pattern gate 242/342 and gate dielectric 240/340, implant source/drain extension implants, form spacers, and form deep source and drain regions S/D.

Advantages of preferred embodiments of the present invention include providing transistor designs 250 and 360 and methods of manufacture thereof, having a channel region C with a shallow germanium implantation region 238 and 338 formed therein. The germanium is implanted using a low energy and high dopant concentration process. Amorphous regions 230 and 330 and damaged areas 234 and 334 are re-crystallized and repaired, respectively, using a low temperature anneal process. Electron and hole mobility in the channel region C is increased, and the effective oxide thickness 246 and 346 is minimized, due to the high concentration of germanium at the top surface 232 and 332 of the workpiece 202 and 302, which minimizes interfacial oxide 244 and 344 formation.

Because a low-temperature anneal process is used to re-crystallize the amorphous germanium implant regions 230 and 330 and also to form the source S and drain D region, the effective oxide thicknesses 246 and 346 of the gate dielectric 240 and 340 are not substantially increased, resulting in a thinner effective gate dielectric thickness (or effective oxide thickness (EOT), 246 and 346, which comprises the total thickness of any thin interfacial oxide layers 244, 344 and 352 and gate dielectric 240 and 340, respectively. The transistors 250 and 360 described herein benefit from a reduced thermal budget and improved gate quality.

Another advantage of embodiments of the present invention is the ability to implant germanium in a plurality of wafers or workpieces 202 and 302 at a single time, e.g., using batch dopant implantation processing tools that are commonly found in semiconductor manufacturing facilities. In one preferred embodiment, the gate dielectric material 340 is formed over the channel region C before the low temperature anneal process to re-crystallize amorphous germanium-implanted region in the workpiece 302, so that the gate dielectric material 340 acts as a capping layer, preventing germanium from outdiffusing or evaporating from the top surface of the workpiece 302, and resulting in an increase in the germanium concentration at the top surface 332 of the workpiece 302.

Again, only one transistor is shown in each figure. However, a plurality of transistors may be formed simultaneously in accordance with embodiments of the present invention, not shown. Furthermore, PMOS and NMOS transistors may be fabricated on a single workpiece, by masking portions of the workpiece while other portions are processed.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A transistor, comprising:
a workpiece, the workpiece comprising a top surface;
a crystalline region disposed within the workpiece, the crystalline region defining a top portion extending from said top surface, said crystalline region further implanted with germanium, wherein the crystalline region extends within the workpiece from the top surface of the workpiece to about 120 Å or less, and said top portion of said crystalline region comprises at least 50% germanium;
a gate dielectric disposed over the crystalline region;
a gate disposed over the gate dielectric; and
a source region and a drain region formed in at least the crystalline region within the workpiece.

2. The transistor according to claim 1, wherein the crystalline region comprises a concentration of about $1 \times 10^{17}$ to about $5 \times 10^{23}$ atoms/cm$^3$ of germamum.

3. The transistor according to claim 1, wherein the crystalline region top portion comprises substantially 100% germanium.

4. The transistor according to claim 1, wherein the crystalline region top portion comprises a thickness of about 20 Å.

5. The transistor according to claim 1, wherein the gate dielectric comprises a material having a dielectric constant of about 4.0 or greater.

6. The transistor according to claim 5, wherein the gate dielectric comprises $HfO_2$, $HfSiO_x$, $Al_2O_3$, $ZrO_2$, $ZrSiO_x$, $Ta_2O_5$, $La_2O_3$, $Si_xN_y$, SiON, or combinations thereof.

7. The transistor according to claim 1, wherein the gate dielectric comprises $SiO_2$.

8. The transistor according to claim 1, further comprising isolation regions disposed in the workpiece, and further comprising spacers formed over and abutting sidewalls of the gate and gate dielectric.

9. The transistor according to claim 1, wherein the workpiece comprises a silicon-on-insulator (SOI) wafer.

10. A transistor, comprising:
a workpiece, the workpiece comprising a top surface;
a crystalline germanium-containing region recrystallized from an amorphous region in a top portion of the workpiece, the recrystallized germanium-containing region extending from said top surface to a level beneath the workpiece top surface, said top portion comprising at least 50% germanium;
another crystalline germanium-containing region beneath the recrystallized germanium-containing region, said another crystalline germanium-containing region extending beneath the recrystallized germanium-containing region from said level;
said recrystallized germanium-containing region and said another crystalline germanium-containing region forming a single crystalline germanium-containing region such that said single crystalline germamum-containing region extends from the top surface of the workpiece, the single crystalline germanium-containing region extending about 120 Å or less beneath the workpiece top surface;
a patterned gate dielectric material having a dielectric constant of about 4.0 or greater and a patterned gate material over the single crystalline germanium-containing region; and
a source region and a drain region in at least the single crystalline germanium-containing region.

11. The transistor of claim 10, wherein the gate dielectric material comprises $HfO_2$, $HfSiO_x$, $Al_2O_3$, $ZrO_2$, $ZrSiO_x$, $Ta_2O_5$, $La_2O_3$, $Si_xNy$, SiON, or combinations thereof.

12. The transistor of claim 10 having an intermediate state comprising a damaged region between the crystalline germanium-containing region and the another crystalline germanium-containing region.

13. The transistor of claim 12 having a subsequent state wherein said damaged region has been repaired such that the crystalline germanium-containing region and the another crystalline germanium-containing region comprise said single crystalline germanium-containing region.

* * * * *

UNITED STATES PATENT AND TRADEMARK OFFICE
CERTIFICATE OF CORRECTION

PATENT NO. : 7,417,248 B2 Page 1 of 1
APPLICATION NO. : 11/446666
DATED : August 26, 2008
INVENTOR(S) : Li It is certified that error appears in the above-identified patent and that said Letters Patent is hereby corrected as shown below:

On the Title Page, Section (56) References Cited, FOREIGN PATENT DOCUMENTS, 1st entry, delete "8/1999" and insert --6/1999--.
On the Title Page, Section (56) References Cited, OTHER PUBLICATIONS, Page 2, Column 1, 3rd entry, delete "338" and insert --336--.
On the Title Page, Section (56) References Cited, OTHER PUBLICATIONS, Page 2, Column 1, 3rd entry, delete "Lettice" and insert --Lattice--.
On the Title Page, Section (56) References Cited, OTHER PUBLICATIONS, Page 2, Column 2, 3rd entry, delete "GeSi" and insert --SiGe--.
On the Title Page, Section (56) References Cited, OTHER PUBLICATIONS, Page 2, Column 2, 7th entry, delete "$Si_{0.17}Ge_{0.63}$" and insert --$Si_{0.17}Ge_{0.83}$--.
In Col. 13, line 40, delete "(20SiO$_2$" and insert --(20% SiO$_2$--.
In Col. 15, line 44, delete "germamum" and insert --germanium--.
In Col. 16, line 9, after and insert --the--.
In Col. 16, line 28, delete "germamum" and insert --germanium--.

Signed and Sealed this

Twenty-fifth Day of November, 2008

JON W. DUDAS
*Director of the United States Patent and Trademark Office*